(12) United States Patent
Sun et al.

(10) Patent No.: US 9,634,042 B2
(45) Date of Patent: Apr. 25, 2017

(54) DISPLAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventors: Tao Sun, Beijing (CN); Tao Gao, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/888,317

(22) PCT Filed: May 19, 2015

(86) PCT No.: PCT/CN2015/079250
§ 371 (c)(1),
(2) Date: Oct. 30, 2015

(87) PCT Pub. No.: WO2016/086616
PCT Pub. Date: Jun. 9, 2016

(65) Prior Publication Data
US 2016/0336356 A1    Nov. 17, 2016

(30) Foreign Application Priority Data
Dec. 2, 2014  (CN) .......................... 2014 1 0720875

(51) Int. Cl.
*H01L 23/12*  (2006.01)
*H01L 23/52*  (2006.01)
(Continued)

(52) U.S. Cl.
CPC ........ *H01L 27/1262* (2013.01); *G06F 1/1652* (2013.01); *H01L 23/373* (2013.01); *H01L 27/12* (2013.01); *H01L 27/1218* (2013.01)

(58) Field of Classification Search
CPC ... H01L 29/94; H01L 23/481; H01L 23/5329; H01L 21/76879; H01L 23/53295; H01L 51/5253; H01L 51/56
(Continued)

(56) References Cited

U.S. PATENT DOCUMENTS

2002/0132443 A1* 9/2002 Winther .............. H01L 21/2007
                                                          438/411
2005/0079706 A1    4/2005 Kumar et al.
(Continued)

FOREIGN PATENT DOCUMENTS

CN    1543678 A    11/2004
CN    1759008 A    4/2006
(Continued)

OTHER PUBLICATIONS

First Office Action regarding Chinese application No. 201410720875.9, dated Aug. 24, 2016. Translation provided by Dragon Intellectual Property Law Firm.
(Continued)

*Primary Examiner* — Kimberly Rizkallah
*Assistant Examiner* — Brian Turner
(74) *Attorney, Agent, or Firm* — Harness, Dickey & Pierce, P.L.C.

(57) ABSTRACT

The present disclosure provides a display substrate, a method for manufacturing the display substrate, and a display device. An intermediate layer is formed on an organic base plate, a thermal expansion coefficient of the intermediate layer is smaller than that of the organic base plate and greater than that of an inorganic thin film, and the inorganic thin film is formed on the intermediate layer.

16 Claims, 2 Drawing Sheets

(51) Int. Cl.
  *H01L 23/532*    (2006.01)
  *H01L 51/52*     (2006.01)
  *H01L 21/768*    (2006.01)
  *H01L 27/12*     (2006.01)
  *H01L 23/373*    (2006.01)
  *G06F 1/16*      (2006.01)

(58) Field of Classification Search
  USPC ....... 257/40, 72; 438/34, 26; 428/141, 473.5
  See application file for complete search history.

(56) References Cited

U.S. PATENT DOCUMENTS

| | | | |
|---|---|---|---|
| 2005/0163445 A1* | 7/2005 | Hanashima | G02B 6/132 385/129 |
| 2009/0152742 A1 | 6/2009 | Ikeguchi et al. | |
| 2015/0014646 A1* | 1/2015 | Kaplan | H01L 51/56 257/40 |

FOREIGN PATENT DOCUMENTS

| | | |
|---|---|---|
| CN | 103483608 A | 1/2014 |
| CN | 104409330 A | 3/2015 |
| WO | WO-2010-137442 A1 | 12/2010 |
| WO | WO-2013-155462 A1 | 10/2013 |

OTHER PUBLICATIONS

Written Opinion of the International Searching Authority for international application No. PCT/CN2015/079250.

* cited by examiner

DISPLAY SUBSTRATE, METHOD FOR MANUFACTURING THE SAME, AND DISPLAY DEVICE

CROSS-REFERENCE TO RELATED APPLICATIONS

This application is the U.S. national phase of PCT Application No. PCT/CN2015/079250 filed on May 19, 2015, which claims a priority to Chinese Patent Application No. 201410720875.9 filed on Dec. 2, 2014, the disclosure of both of which are incorporated in their entirety by reference herein.

TECHNICAL FIELD

The present disclosure relates to the field of display technology, in particular to a display substrate, a method for manufacturing the same, and a display device.

BACKGROUND

Conventional displaying is based on flat panels which cannot be bent freely. A trend of displaying is to display a large quantity of information on a flexible body, i.e., flexible displaying. Flexible display screens and flexible display modules can be mechanically bent at any step of encapsulating, manufacturing, storing, utilizing, operating, carrying or transporting substrates and between adjacent processes. Key technologies for achieving the flexible displaying mainly include: display technology, substrate technology, array technology and encapsulation technology. Currently, there exist three kinds of substrates for the flexible displaying, i.e., ultra-thin glass substrate, metal foil substrate and plastic substrate.

The ultra-thin glass substrate may provide well resistance to water and oxygen and have well transparency. However, it is sensitive to cracks and has poor impact resistance and poor flexural endurance, so it is difficult to perform a roll-to-roll process and develop a flexible ultra-thin glass substrate. The metal foil substrate may provide well resistance to water, oxygen and high temperature, together with low cost and well ductility, so it is easy to perform the roll-to-roll process. However, a surface of the foil is rough (Ra=0.6 μm), and a planarization layer is required to be coated onto the surface even when it has been polished. As a result, a device thickness will increase. The plastic substrate is more flexible, lighter and more impact-resistant, so it is suitable for the manufacture of a light and thin device, and thereby becomes a trend of the flexible display technology.

Usually, the plastic substrate is not resistant to high temperature, and it may be deformed remarkably at the high temperature. Hence, manufacturing processes for a flexible display device must be accomplished at a very low temperature. In order to achieve a high-temperature manufacturing process, it is required to select a heat-resistant plastic substrate and coat it onto a glass substrate.

A flexible display device includes semiconductor elements (e.g., thin film transistors (TFTs)) which need to be manufactured at a high temperature. During the high-temperature manufacturing process, the plastic substrate may be subjected to thermal weight loss and may release small-molecule solvents and impurities, resulting in adverse influences on the characteristics of the TFTs and thereby the image quality. A solution in the related art is to form an inorganic thin film on the plastic substrate as a barrier layer, so as to prevent the semiconductor elements from being adversely affected by the organic base plate during the high-temperature manufacturing process. However, crystal lattices of the plastic substrate and the inorganic thin film do not match (that is, material stresses do not match). Since the plastic substrate is an organic layer with a relatively large thermal expansion coefficient, it may be deformed remarkably during the high-temperature manufacturing process, and after the plastic substrate is cooled to a normal temperature, the inorganic thin film may be subjected to the thermal stress. As a result, microcracks may easily occur and the inorganic thin film may easily fall off from the plastic substrate.

SUMMARY

An object of the present disclosure is to provide a display substrate and a method for manufacturing the same, so as to prevent the occurrence of microcracks and the falling of an inorganic thin film from an inorganic substrate due to different thermal expansion coefficients of the inorganic substrate and the inorganic thin film. Another object of the present disclosure is to provide a display device including the above-mentioned display substrate, so as to improve the product yield.

In one aspect, the present disclosure provides in one embodiment a manufacturing method for a display substrate. The display substrate includes an organic base plate, an inorganic thin film and an intermediate layer located between the organic base plate and the inorganic thin film. A thermal expansion coefficient of the intermediate layer is smaller than that of the organic base plate, and greater than that of the inorganic thin film.

The manufacturing method includes steps of:

forming the intermediate layer which covers a surface of the organic base plate; and forming the inorganic thin film on a surface of the intermediate layer Alternatively, the thermal expansion coefficient of one side of the intermediate layer close to the organic base plate is greater than that of one side of the intermediate layer close to the inorganic thin film.

Alternatively, the thermal expansion coefficient of the intermediate layer gradually decreases from the side close to the organic base plate to the side close to the inorganic thin film.

Alternatively, the step of forming the intermediate layer which covers the surface of the organic base plate includes: forming the intermediate layer through a chemical reaction of gases from a reactive source.

Alternatively, the step of forming the intermediate layer which covers the surface of the organic base plate further includes: adjusting the thermal expansion coefficient of the intermediate layer by adjusting a proportion of the gases from the reactive source.

Alternatively, the reactive source includes a Si-containing material having a carbon-oxygen bond, and an oxide, and the thermal expansion coefficient of the intermediate layer is decreased by increasing a content of the oxide in the chemical reaction.

Alternatively, the Si-containing material having the carbon-oxygen bond includes hexamethyl disiloxane or tetraethyl orthosilicate.

Alternatively, the entire intermediate layer is of the same thermal expansion coefficient.

Alternatively, the manufacturing method further includes:
providing an inorganic base plate; and forming the organic base plate by forming an organic thin film which covers a surface of the inorganic base plate.

Alternatively, the inorganic base plate includes a glass base plate or a metal foil base plate, and the organic thin film is made of plastics.

Alternatively, the manufacturing method further includes forming a semiconductor element on the inorganic thin film.

In another aspect, the present disclosure provides in one embodiment a display substrate, including: an organic base plate; an intermediate layer covering a surface of the organic base plate; and an inorganic thin film arranged on a surface of the intermediate layer. A thermal expansion coefficient of the intermediate layer is smaller than that of the organic base plate and greater than that of the inorganic thin film, and the intermediate layer is located between the organic base plate and the inorganic thin film.

Alternatively, the thermal expansion coefficient of one side of the intermediate layer close to the organic base plate is greater than that of one side of the intermediate layer close to the inorganic thin film.

Alternatively, the thermal expansion coefficient of the intermediate layer gradually decreases from the side close to the organic base plate to the side close to the inorganic thin film.

Alternatively, the entire intermediate layer is of the same thermal expansion coefficient.

Alternatively, the organic base plate is formed by an organic thin film which covers a surface of an inorganic base plate.

Alternatively, the display substrate further includes a semiconductor element arranged on the inorganic thin film.

In yet another aspect, the present disclosure provides in one embodiment a display device including the above-mentioned display substrate.

According to the embodiments of the present disclosure, the intermediate layer is formed on the organic base plate, the thermal expansion coefficient of the intermediate layer is set to be smaller than that of the organic base plate and greater than that of the inorganic thin film, and the inorganic thin film is formed on the intermediate layer. As a result, it is able to alleviate an influence caused by a thermal stress of the organic base plate on the inorganic thin film, and prevent the occurrence of microcracks and the falling of the inorganic thin film from the organic substrate, thereby to improve the product yield as well as the display quality of the display device.

BRIEF DESCRIPTION OF THE DRAWINGS

In order to illustrate the technical solutions of the present disclosure or the related art in a clearer manner, the drawings desired for the embodiments of the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

Figure 1:
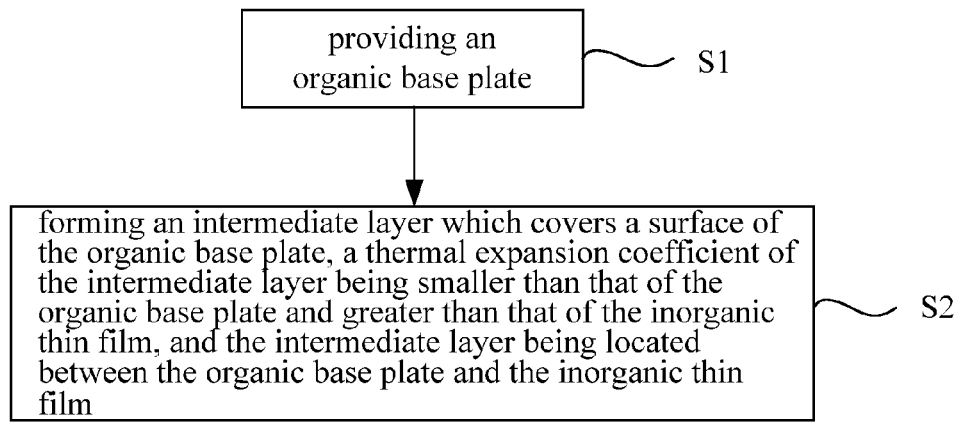
FIG. 1 is a flow chart of a method for manufacturing a substrate according to one embodiment of the present disclosure.

The present disclosure provides in one embodiment a substrate, which serves as a base plate for an inorganic thin film. The substrate includes an organic base plate and an intermediate layer covering a surface of the organic base plate. A thermal expansion coefficient of the intermediate layer is smaller than that of the organic base plate and greater than that of the inorganic thin film. The intermediate layer is located between the organic base plate and the inorganic thin film. The organic base plate is more flexible, lighter and more impact-resistant, but it has a large thermal expansion coefficient and may be deformed remarkably at a high temperature. Since a thermal expansion coefficient of an inorganic material is far smaller than a thermal expansion coefficient of an organic material, it is able to, through the intermediate layer, alleviate an influence caused by thermal stress of the organic base plate on the inorganic thin film, thereby to prevent the occurrence of microcracks and falling of the inorganic thin film from the organic base substrate.

In the case that the substrate according to the embodiment of the present disclosure is applied in a display substrate, it is able to improve the yield of a display device.

The substrate according to the embodiment of the present disclosure is specifically applicable to a flexible display device.

It should be noted that, the larger the thermal expansion coefficient of a material, the smaller the stress of the material, the greater the deformation at a high temperature, and the larger the thermal stress generated after returning to a normal temperature. In contrast, the smaller the thermal expansion coefficient of a material, the larger the stress of the material, the smaller the deformation at the high temperature, and the smaller the thermal stress generated after returning to the normal temperature. Since the thermal expansion coefficient of the organic material is far larger than that of the inorganic material, the stress of the organic material is far smaller than that of the inorganic material.

The stress refers to interaction forces generated among respective parts inside an object when the object is deformed due to external causes (external force, moisture, temperature field change or the like), so as to counteract the influences from the external causes and enable the object to be recovered from the deformation.

The thermal stress refers to a stress generated when the object cannot expand or shrink freely as the temperature changes due to external restrictions and mutual restrictions among different parts inside the object. The thermal stress is also called as temperature change stress.

In the embodiments of the present disclosure, the display substrate is manufactured at a high temperature, so the inorganic thin film formed on the surface of the organic base plate has a relatively compact molecular structure, resulting in a relatively large stress between molecules. In addition, the organic material is formed by macromolecular bonding, and there is enough space for macromolecular chains, so the stress between the molecules is relatively small.

The present disclosure will be described hereinafter in conjunction with the drawings and embodiments. The following embodiments are for illustrative purposes only, but shall not be used to limit the scope of the present disclosure.

FIG. 1 is a flow chart of a method for manufacturing a substrate according to one embodiment of the present disclosure.

As shown in FIG. 1, the substrate serves as a base plate for an inorganic thin film, and the manufacturing method includes:

step S1: providing an organic base plate; and step S2: forming an intermediate layer which covers a surface of the organic base plate.

A thermal expansion coefficient of the intermediate layer is smaller than that of the organic base plate and greater than that of the inorganic thin film, i.e., a stress of the intermediate layer is greater than that of the organic base plate and smaller than that of the inorganic thin film. The intermediate layer is located between the organic base plate and the inorganic thin film.

During a high-temperature manufacturing process, the thermal expansion coefficient of the intermediate layer is relatively small, and the deformation of the organic base plate is greater than that of the intermediate layer. After it returns to a normal temperature, it is able to, through the intermediate layer, alleviate an influence caused by thermal stress of the organic base plate on the inorganic thin film, thereby to prevent the occurrence of microcracks and the falling of the inorganic thin film from the organic base substrate.

The substrate including the organic base plate in the embodiment of the present disclosure is more flexible, lighter and more impact-resistant, and further it is able to ensure the quality of the inorganic thin film formed on the substrate. Hence, the substrate is especially applicable to a flexible display device.

Figure 3:
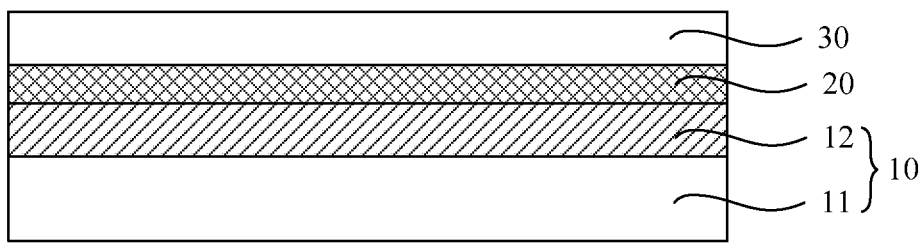
FIG. 3 is a schematic view showing the substrate according to one embodiment of the present disclosure.

Correspondingly, as shown in FIG. 3, the present disclosure provides in one embodiment a substrate which serves as a base plate for an inorganic thin film 30. The substrate includes an organic base plate 10 and an intermediate layer 20 covering a surface of the organic base plate 10. A thermal expansion coefficient of the intermediate layer 20 is smaller than that of the organic base plate 10 and greater than that of the inorganic thin film 30. The intermediate layer 20 is located between the organic base plate 10 and the inorganic thin film 30.

The entire intermediate layer 20 may be of the same thermal expansion coefficient, so as to simplify the manufacturing process. In the case that the intermediate layer 20 is relatively thick, it is still able for the intermediate layer to alleviate the thermal stress generated by the organic base plate 10.

Figure 4:
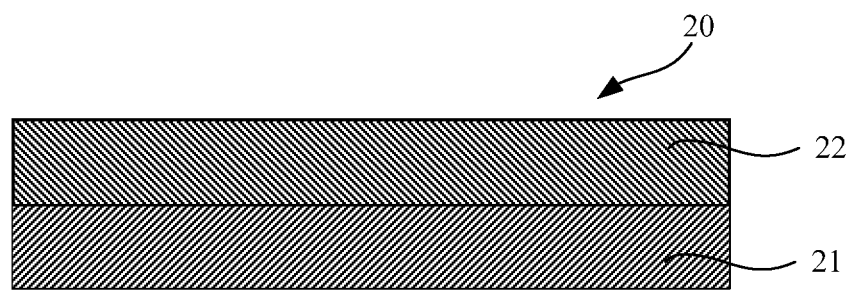
FIG. 4 is a schematic view showing an intermediate layer according to one embodiment of the present disclosure.

Alternatively, as shown in FIG. 4, the intermediate layer 20 includes a first portion 21 close to the organic base plate 10 and a second portion 22 close to the inorganic thin film 30. A thermal expansion coefficient of the first portion 21 is greater than that of the second portion 22 and smaller than that of the second portion 22. After the organic base plate 10 expands at a high temperature and then returns to a normal temperature, the generated stress may be alleviated by the first portion 21 and the second portion 22 successively and then applied to the inorganic thin film 30. Hence, a smaller thermal stress is applied to the inorganic thin film 30, and it is able to prevent the occurrence of microcracks and the falling of the inorganic thin film 30 from the organic base plate 10.

Furthermore, from one side close to the organic base plate 10 to one side close to the inorganic thin film 30, the thermal expansion coefficient of the intermediate layer 20 gradually decreases and the stress of the intermediate layer 20 gradually increases, so as to alleviate the thermal stress generated by the organic base plate 10 in a better manner.

A change in the thermal expansion coefficient of the intermediate layer 20 may be achieved through different materials. For example, as shown in FIG. 4, in the case that the intermediate layer includes the first portion 21 close to the organic base plate 10 and the second portion 22 close to the inorganic thin film 30, a film of a first material having a relatively large thermal expansion coefficient is coated on the organic base plate 10 to form the first portion 21, and then a film of a second material having a relatively small thermal expansion coefficient is coated on the first portion 21 to form the second portion 22.

In the embodiment of the present disclosure, the intermediate layer 20 is formed through a chemical reaction of gases from a reactive source, so the thermal expansion coefficient of the intermediate layer 20 may be adjusted by adjusting a proportion of the gases during the chemical reaction. Specifically, the reactive source may include a Si-containing material having a carbon-oxygen bond and an oxide, and the thermal expansion coefficient of the intermediate layer 20 may be decreased by increasing a content of the oxide. The Si-containing material having the carbon-oxygen bond may be hexamethyl disiloxane or tetraethyl orthosilicate.

Figure 2:
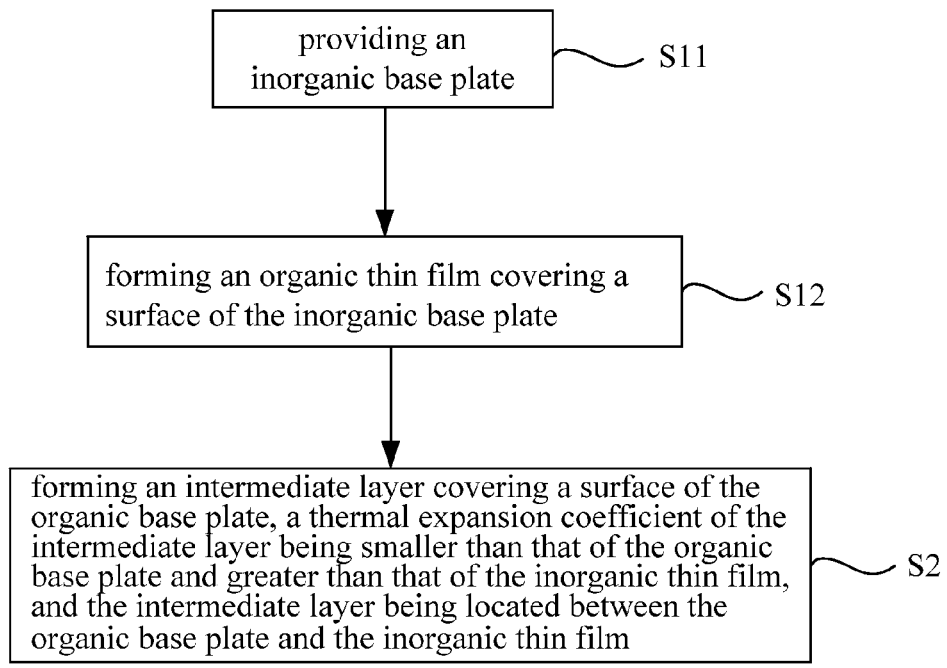
FIG. 2 is another flow chart of a method for manufacturing the substrate according to one embodiment of the present disclosure.

In the embodiment of the present disclosure, the display substrate is manufactured inevitably at a high temperature, and a heat-resistant organic material may be selected for the organic base plate 10 in order to reduce the deformation of the organic base plate 10 at a high temperature. In this case, as shown in FIG. 2, the method for manufacturing the substrate may further include:

step S11: providing an inorganic base plate; and step S12: forming an organic thin film covering a surface of the inorganic base plate.

As shown in FIG. 3, an organic base plate 10 is formed on the inorganic base plate 11, so as to form the organic thin film 12.

The intermediate layer 20 of the substrate covers a surface of the organic thin film 12, and the thermal expansion coefficient of the intermediate layer 20 is smaller than that of the organic thin film 12.

The inorganic base plate 11 may be a glass base plate or a metal foil base plate. The organic thin film 12 may be made of heat-resistant plastics. In a flexible display device, the plastics may usually be made of polyimide (PI), polyethylene naphthalate (PEN), polyethylene terephthalate (PET) or the like.

The organic base plate 10 formed as mentioned above is relatively heat-resistant, and the thermal stress generated thereby may be reduced.

Correspondingly, as shown in FIG. 3, the substrate according to one embodiment of the present disclosure includes:

the inorganic base plate 11;

the organic thin film 12 covering a surface of the inorganic base plate 11; and the intermediate layer 20 covering a surface of the organic thin film 12.

When forming the inorganic thin film 30 on the intermediate layer 20 at a high temperature, the deformation of the organic thin film 12 and the resultant thermal stress are relatively small since the organic thin film 12 is made of the heat-resistant organic material, thereby it is able to reduce the thermal stress applied to the inorganic thin film 30.

As shown in FIG. 3, the substrate includes:

the inorganic base plate 11;

the organic thin film 12 covering a surface of the inorganic base plate 11; and the intermediate layer 20 covering a surface of the organic thin film 12.

The inorganic thin film 30 of a display device is formed on the intermediate layer 20.

The entire intermediate layer 20 may be of the same thermal expansion coefficient. Alternatively, the thermal expansion coefficient of one side of the intermediate layer 20 close to the organic thin film 12 is larger than that of one side of the intermediate layer 20 close to the inorganic thin film 30, or from the side close to the organic thin film 12 to the side close to the inorganic thin film 30, the thermal expansion coefficient of the intermediate layer 20 gradually decreases.

The present disclosure further provides in one embodiment a method for manufacturing a display substrate including a substrate. The manufacturing method includes:

manufacturing the substrate using the above-mentioned method, the substrate including an organic base plate and an intermediate layer covering a surface of the organic base plate; and forming an inorganic thin film on the intermediate layer covering the surface of the organic base plate.

In the above manufacturing method, the intermediate layer is formed between the inorganic thin film and the organic thin film, a thermal expansion coefficient of the intermediate layer is smaller than that of the organic base plate and greater than that of the inorganic thin film. During a high-temperature manufacturing process, it is able for the intermediate layer to alleviate a thermal stress exerted by the organic base plate onto the inorganic thin film, thereby to prevent the occurrence of microcracks and the falling of the inorganic thin film from the organic base plate.

Correspondingly, the present disclosure further provides in one embodiment a display substrate, which includes the above-mentioned substrate. As shown in FIG. 3, the substrate includes the organic base plate 10 and the intermediate layer 20 covering a surface of the organic base plate 10. The display substrate further includes the inorganic thin film 30 formed on the intermediate layer 20 covering the surface of the organic base plate 10.

The substrate may further include the inorganic base plate 11 and the organic thin film 12 covering a surface of the inorganic base plate 11. The organic thin film 12 is formed on the inorganic base plate 11 so as to form the organic base plate 10. The organic thin film 12 is made of a heat-resistant material.

In the embodiment of the present disclosure, the display substrate further includes semiconductor elements (e.g., TFTs). During the high-temperature process for manufacturing the semiconductor elements, the organic thin film 12 may be subjected to thermal weight loss and may release micromolecular solvents and impurities, resulting in an adverse effect on the characteristics of the semiconductor elements as well as the image quality. In the case that the semiconductor elements are formed on the inorganic thin film 30, the inorganic thin film 30 may function as a barrier layer, so as to effectively prevent the semiconductor elements from being adversely affected by the organic thin film 12 during the high-temperature process, thereby to improve the image quality of the display device.

Correspondingly, the method for manufacturing the display substrate further includes:

forming the semiconductor elements on the inorganic thin film.

As shown in FIG. 3, the display substrate specifically includes:

the inorganic base plate 11;

the organic thin film 12 covering a surface of the inorganic base plate 12;

the intermediate layer 20 covering a surface of the organic thin film 12, a thermal expansion coefficient of the intermediate layer 20 being smaller than that of the organic thin film 12;

the inorganic thin film 30 covering a surface of the intermediate layer 20, the thermal expansion coefficient of the intermediate layer 20 being larger than that of the inorganic thin film 30; and the semiconductor elements (not shown) arranged on the inorganic thin film 30.

The present disclosure further provides in one embodiment a display device which includes the above-mentioned display substrate, so as to improve the display quality.

The substrate in the embodiments of the present disclosure is specifically applicable to a flexible display device. Of course, it is also be applicable to any other display devices.

According to the embodiments of the present disclosure, the intermediate layer is formed on the organic base plate, the thermal expansion coefficient of the intermediate layer is set to be smaller than that of the organic base plate and greater than that of the inorganic thin film, and the inorganic thin film is formed on the intermediate layer. As a result, it is able to alleviate an influence caused by a thermal stress of the organic base plate on the inorganic thin film, and prevent the occurrence of microcracks and the falling of the inorganic thin film from the organic substrate, thereby to improve the product yield as well as the display quality of the display device.

The above are merely preferred embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A manufacturing method for a display substrate, wherein the display substrate comprises an organic base plate, an inorganic thin film and an intermediate layer located between the organic base plate and the inorganic thin film, a thermal expansion coefficient of the intermediate layer is smaller than that of the organic base plate and greater than that of the inorganic thin film, wherein the manufacturing method comprises steps of:

forming the intermediate layer which covers a surface of the organic base plate through a chemical reaction of gases from a reactive source, wherein the reactive source comprises an oxide and a Si-containing material having a carbon-oxygen bond, and the thermal expansion coefficient of the intermediate layer is adjusted by varying a content of the oxide during the chemical reaction; and forming the inorganic thin film on a surface of the intermediate layer.

2. The manufacturing method according to claim 1, wherein the thermal expansion coefficient of one side of the intermediate layer close to the organic base plate is larger than that of one side of the intermediate layer close to the inorganic thin film.

3. The manufacturing method according to claim 2, wherein the thermal expansion coefficient of the intermediate layer gradually decreases from the side close to the organic base plate to the side close to the inorganic thin film.

4. The manufacturing method according to claim 1, wherein the thermal expansion coefficient of the intermediate layer is decreased by increasing the content of the oxide during the chemical reaction.

5. The manufacturing method according to claim 4, wherein the Si-containing material having the carbon-oxygen bond comprises hexamethyl disiloxane or tetraethyl orthosilicate.

6. The manufacturing method according to claim 1, wherein the entire intermediate layer is of the same thermal expansion coefficient.

7. The manufacturing method according to claim 1, further comprising:
providing an inorganic base plate; and
forming the organic base plate by forming an organic thin film which covers a surface of the inorganic base plate.

8. The manufacturing method according to claim 7, wherein the inorganic base plate comprises a glass base plate or a metal foil base plate, and the organic thin film is made of plastics.

9. The manufacturing method according to claim 1, further comprising:
forming a semiconductor element on the inorganic thin film.

10. A display substrate, manufactured according to the method of claim 1.

11. The display substrate according to claim 10, wherein the thermal expansion coefficient of one side of the intermediate layer close to the organic base plate is larger than that of one side of the intermediate layer close to the inorganic thin film.

12. The display substrate according to claim 11, wherein the thermal expansion coefficient of the intermediate layer gradually decreases from the side close to the organic base plate to the side close to the inorganic thin film.

13. The display substrate according to claim 10, wherein the entire intermediate layer is of the same thermal expansion coefficient.

14. The display substrate according to claim 10, wherein the organic base plate is formed by an organic thin film which covers a surface of an inorganic base plate.

15. The display substrate according to claim 14, further comprising:
a semiconductor element arranged on the inorganic thin film.

16. A display device, comprising the display substrate according to claim 10.

* * * * *